United States Patent [19]

Julien et al.

[11] Patent Number: 5,423,376
[45] Date of Patent: Jun. 13, 1995

[54] HEAT EXCHANGER FOR ELECTRONIC COMPONENTS AND ELECTRO-TECHNICAL EQUIPMENT

[75] Inventors: Jean-Noël Julien, Beaucaire; Jean-Paul Ouvrel, Bollene, both of France

[73] Assignee: Ferraz a French Societe Anonyme, Lyons, France

[21] Appl. No.: 194,277

[22] Filed: Feb. 10, 1994

[30] Foreign Application Priority Data

Feb. 12, 1993 [FR] France .................. 93 01870

[51] Int. Cl.⁶ .................. F28F 3/00; F28F 7/00
[52] U.S. Cl. .................. 165/80.4; 165/168; 165/185; 257/714; 361/701; 361/702
[58] Field of Search .......... 165/80.4, 80.5, 185, 165/168, 76, 78; 257/714; 361/699, 701, 702

[56] References Cited

U.S. PATENT DOCUMENTS

| | | | |
|---|---|---|---|
| 3,361,195 | 1/1968 | Meyerhoff et al. | 257/714 X |
| 3,548,933 | 12/1970 | Bain | 165/167 |
| 3,736,961 | 6/1973 | Walsh | 165/179 X |
| 4,151,548 | 4/1979 | Klein et al. | 165/80.4 X |
| 4,188,996 | 2/1980 | Pellant et al. | 165/80.4 |
| 4,494,171 | 1/1985 | Bland et al. | 165/80.4 |
| 4,546,614 | 10/1985 | Kline et al. | 165/185 X |
| 4,546,621 | 10/1985 | Kline et al. | 165/185 X |
| 4,559,580 | 12/1985 | Lufty | 165/80.4 X |
| 5,275,237 | 1/1994 | Rolfson et al. | 165/80.4 X |

FOREIGN PATENT DOCUMENTS 194216 2/1986 European Pat. Off. ............ 257/714

Primary Examiner—John Rivell
Assistant Examiner—L. R. Leo
Attorney, Agent, or Firm—Dowell & Dowell

[57] ABSTRACT

A heat exchanger for electronic components and electro-technical equipment which includes a housing having an inner space through which a heat exchange fluid may pass wherein the housing is formed by opposing covers between which a stack of plates is mounted with each plate having openings profiled and oriented so as to allow the passage of the heat exchange fluid therebetween and which plates are connected to the covers by joining pieces.

8 Claims, 3 Drawing Sheets

HEAT EXCHANGER FOR ELECTRONIC COMPONENTS AND ELECTRO-TECHNICAL EQUIPMENT

BACKGROUND OF THE INVENTION

The present invention relates to heat exchangers intended to be associated with electronic components and other electro-technical equipment.

HISTORY OF THE RELATED ART

Known exchangers of this type are, in practice, generally constituted by two relatively solid metal pieces in which is machined a channel in the form of a coil. It will be understood that the circulation of a heat-exchange liquid through the coil ensures the heat exchange, i.e. the evacuation or, on the contrary, the supply, of calories for maintaining the electronic component at the desired temperature.

Nevertheless, such exchangers are relatively expensive to produce due to the complexity both of the operations for machining the pieces and those involved in assembly thereof. Furthermore, machining fixes a limited exchange surface and a considerable pressure drop. This mode of manufacture is particularly rigid in that it is very difficult, within the framework of the same manufacture, to vary the capacity of heat exchange and the hydraulic performances of the device.

It is a principal object of the present invention to overcome these drawbacks.

SUMMARY OF THE INVENTION

To that end, the invention consists in stacking and soldering thin, openwork plates between two covers, the soldering ensuring maintenance, thermal bond and hermetic nature of the constituent pieces. Two lateral joining pieces allow the exchanger to be connected to a fluid circuit.

With small dimensions, such an exchanger presents a very large heat exchange surface. Furthermore, it is easy to modify the exchange characteristics since it suffices to vary the number of openwork plates, with the structure of the plates and of the covers remaining identical.

BRIEF DESCRIPTION OF THE DRAWINGS

The invention will be more readily understood on reading the following description with reference to the accompanying drawings, in which:

FIG. 4 is a section along the plane indicated at IV—IV in FIG. 3.

DESCRIPTION OF PREFERRED EMBODIMENT

Figure 1:
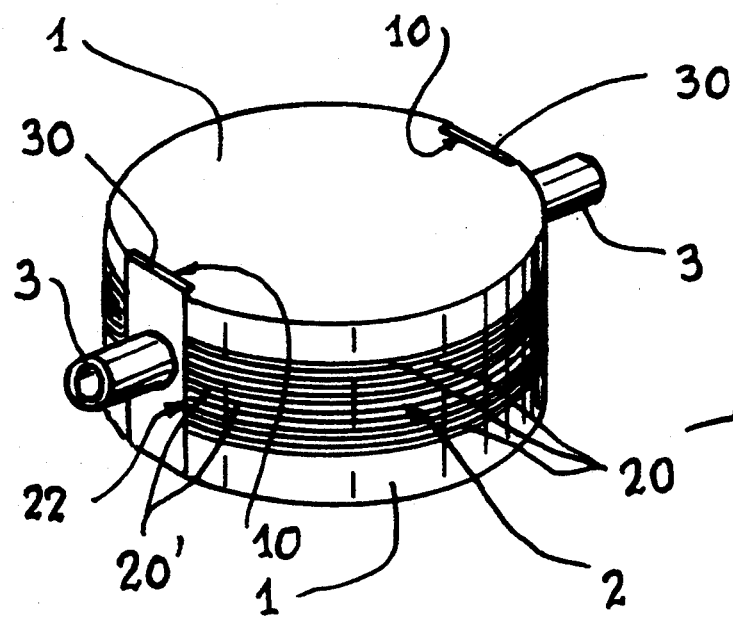
FIG. 1 is a view in perspective of a heat exchanger according to the invention.

Referring now to the drawings, the exchanger shown in FIG. 1 is in the form of a box housing, of cylindrical section in the embodiment shown. This box comprises two opposite covers 1 between which is housed an envelope 2 completed by two joining pieces 3, having fluid openings 3', for connection diametrally opposite each other in the present case.

Figure 2:
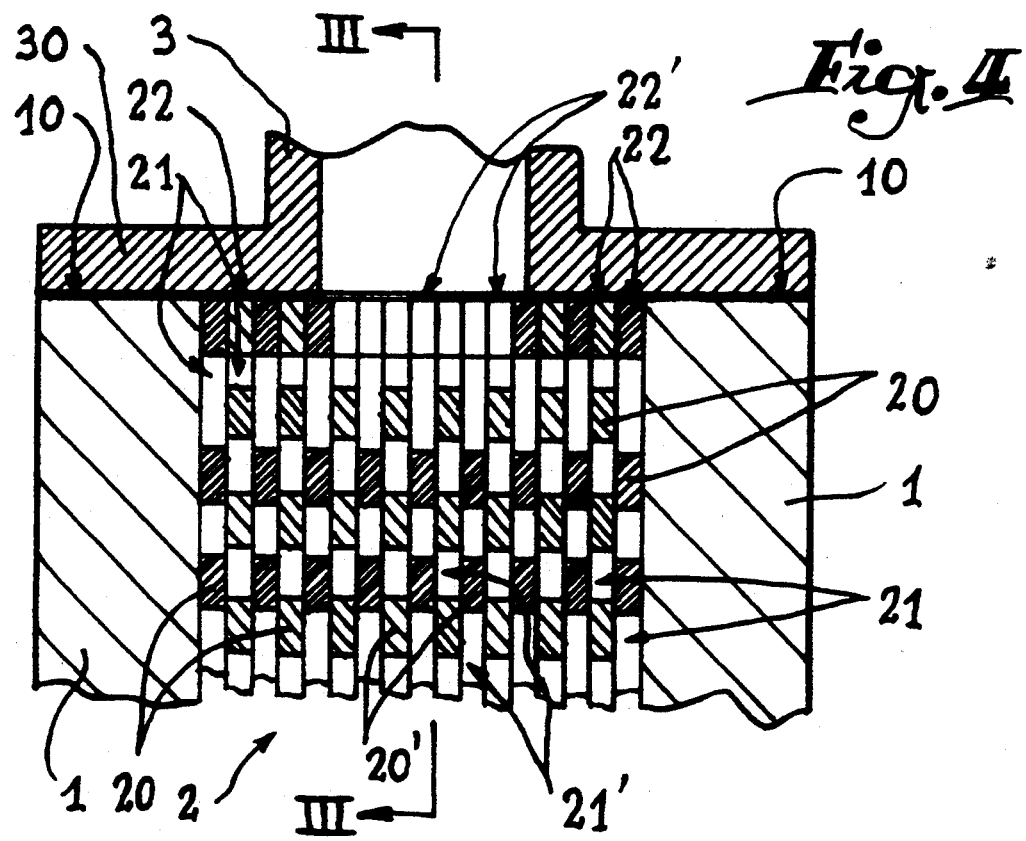
FIG. 2 is an assembly view of the exchanger of FIG. 1.
Figure 2:
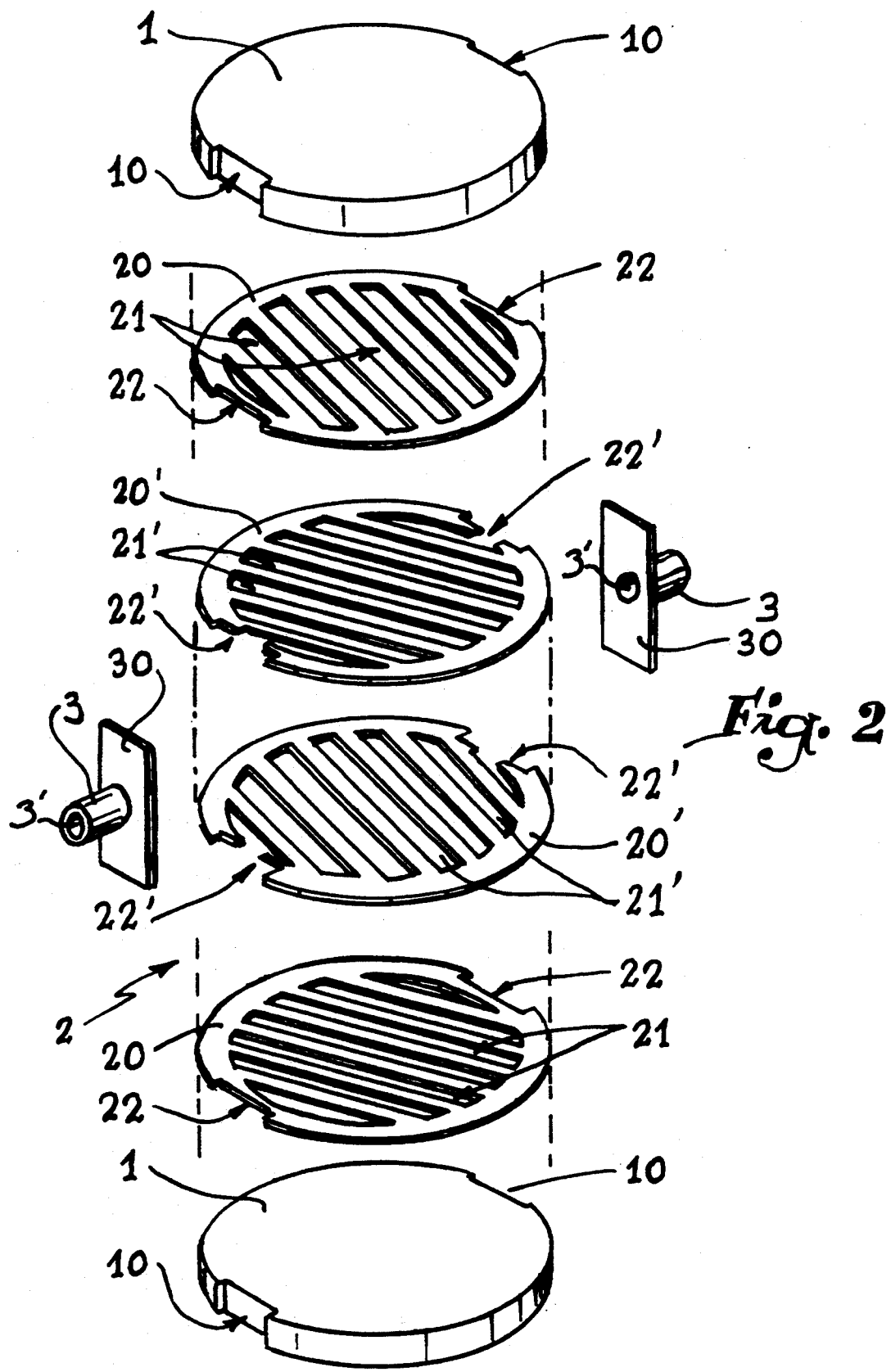

As illustrated in FIG. 2, envelope 2 is formed by a stack of openwork plates 20, each having a reduced thickness. Each plate 20 is made by cutting out from a plane strip of metal such as copper, aluminium or an alloy, at least one of the faces of the strip being coated with a superficial soldering layer.

It should be observed that the openwork made in each plate 20 during cutting defines a series of elongated openings 21 oriented parallel to one another. Furthermore, each plate 20 comprises two diametrally opposite notches 22, the axis joining these two notches 22 being oriented obliquely with respect to the axis of the openings 21. It will further be noted that, on certain of the plates referenced 20', each of the two notches 22' opens into the opening 21' which is adjacent thereto.

The length of each notch 22 or 22' is equal, to within a very slight clearance, to the width of a flange 30 secured to each of the two joining pieces 3; the height of this flange 30 is substantially equal to that of the box, the covers 1 being notched at 10.

In order to constitute the stack forming the envelope 2 of the box, two identical assemblies are firstly made, of which each comprises the same number of plates 20, care being taken to arrange the plates in pairs, by turning, so that in each pair the openings 21 intersect one another. Between the two assemblies thus constituted, there is inserted a third, formed by plates 20' disposed in crossed pairs, in the same manner as the plates 20. The two joining pieces 3 are oriented so that their flange 30 fits in the notches 10, 22 and 22', a soldering pellet being is interposed between said flange and the bottom of the notches.

Figure 3:
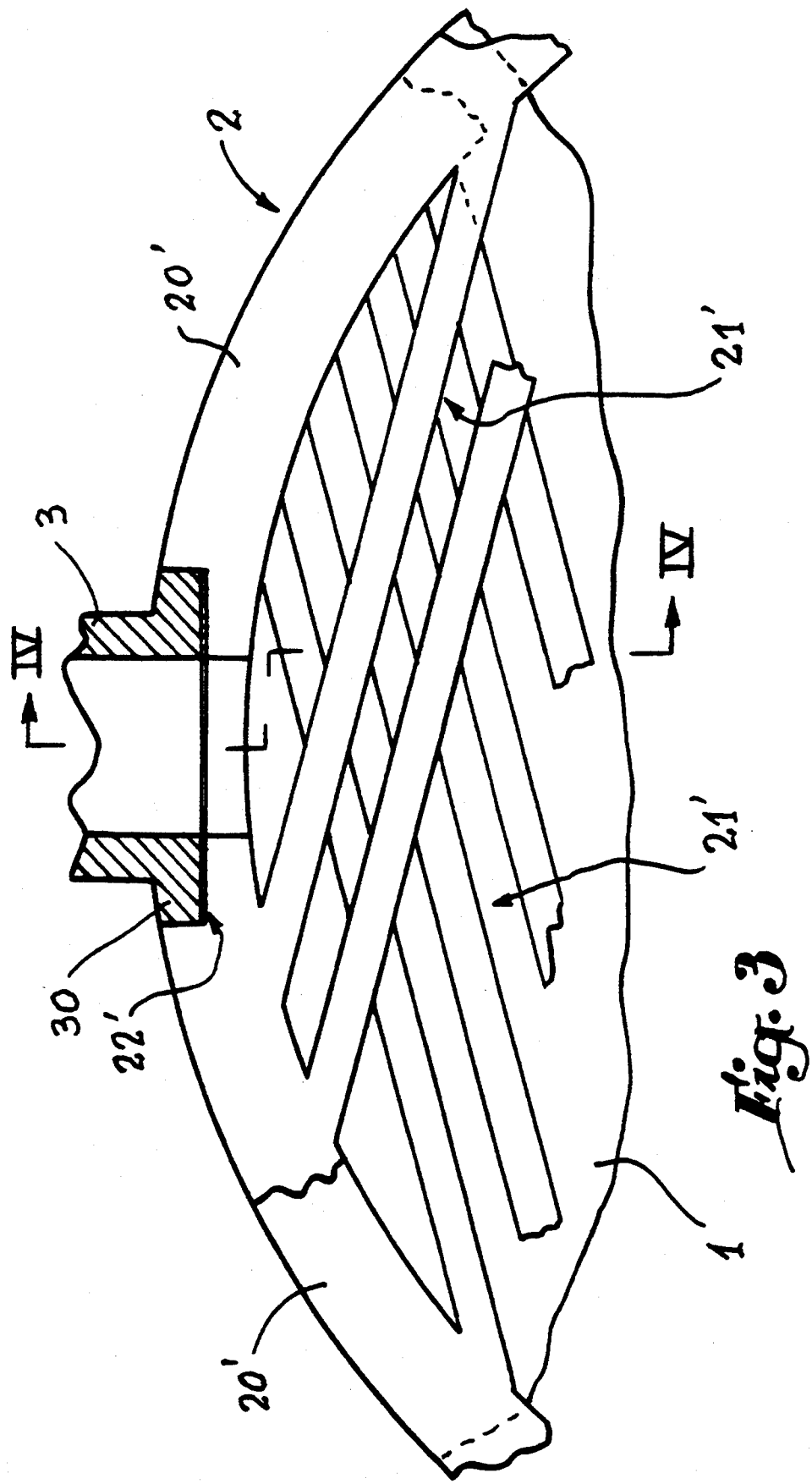
FIG. 3 is a schematic partial section of the connecting pieces of the present invention taken along line III—III of FIG. 4.

The pieces thus disposed are then subjected to a soldering operation in vacuo and under pressure, with the result that the monobloc box as shown in FIGS. 1, 3 and 4 is finally obtained, the soldering ensuring tightness of the periphery and connection of the plates over their whole surface. The inner space of each joining piece 3 is oriented along the axis of the notches 22' so that the heat exchange liquid which supplies the exchanger may penetrate in the box through one of the joining pieces, circulate through the openings 21 and 21' of the plates, and leave through the opposite joining piece 3 after having yielded its calories to the box and to the component carried thereby, or, on the contrary, after having supplied to the box and component the calories necessary for the desired heat conditioning.

FIG. 4 clearly shows that the intersection of the openings 21 and 21' of the plates determines for the conditioning fluid a baffle circuit which, further to the large exchange surface, ensures particularly high performances with remarkably reduced dimensions.

It goes without saying that the joining pieces 3 may be fixed on the box so that their axes are offset with respect to each other; in certain cases, these joining pieces may be secured, not with the envelope 2 formed by the stack of plates, but with one and/or the other of the two lateral covers 1, the fluid in that case traversing the stack perpendicularly to the plane thereof.

The openwork of the plates may be provided to be asymmetrical, with a view to promoting heat conditioning of certain zones, to the detriment of others. This openwork may, of course, present any appropriate profile.

It must, moreover, be understood that the foregoing description has been given only by way of example and that it in no way limits the domain of the invention which would not be exceeded by replacing the details of execution described by any other equivalents. It goes without saying that the plates and covers may present any desired polygonal profile.

What is claimed is:

1. A heat exchanger for electronic components and electro-technical equipment comprising, a housing having an inner space transversed by a heat-exchange fluid, said housing having opposing covers for heat exchange with said components and equipment, a plurality of plates forming a stack of plates, each of said plates having openings therein, two joining pieces for connecting said stack of plates between said covers, each of said openings in said plates having an elongated profile and oriented obliquely with respect to an axis extending between said joining pieces, and said plates being oriented so said openings of two adjacent of said plates intersect with one another.

2. The heat exchanger of claim 1 wherein each of said plates includes a peripheral edge, a pair of oppositely oriented notches formed in said edge of each of said plates, each of said joining pieces including a flange portion engageable within said notches of said plates.

3. The heat exchanger of claim 2 in which each of said opposing covers includes a peripheral edge, a pair of oppositely oriented notches in said covers, and said flange portion of said joining pieces being engageable within said notches of said covers.

4. The heat exchanger of claim 3 in which each of said joining pieces includes a fluid opening therethrough by way of which the heat-exchange fluid communicates with said inner space of said housing.

5. The heat exchanger of claim 4 wherein said notches of at least one of said plates are in open communication with one of said openings therein.

6. The heat exchanger of claim 5 in which said notches in said plates are oriented obliquely with respect to said openings therein.

7. The heat exchanger of claim 2 in which said notches in said plates are oriented obliquely with respect to said openings therein.

8. The heat exchanger of claim 1 in which each of said joining pieces includes a fluid opening therethrough by way of which the heat-exchange fluid communicates with said inner space of said housing.

* * * * *